US007432638B2

(12) United States Patent
Yamashita et al.

(10) Patent No.: US 7,432,638 B2
(45) Date of Patent: Oct. 7, 2008

(54) ACOUSTIC BACKING COMPOSITION, ULTRASONIC PROBE AND ULTRASONIC DIAGNOSTIC APPARATUS

(75) Inventors: Yohachi Yamashita, Yokohama (JP); Yasuharu Hosono, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 550 days.

(21) Appl. No.: 11/150,276

(22) Filed: Jun. 13, 2005

(65) Prior Publication Data

US 2005/0275313 A1 Dec. 15, 2005

(30) Foreign Application Priority Data

Jun. 15, 2004 (JP) ............................ 2004-176333
Jun. 15, 2004 (JP) ............................ 2004-176334
Jun. 1, 2005 (JP) ............................ 2005-161985

(51) Int. Cl.
*H01L 41/08* (2006.01)

(52) U.S. Cl. ........................ 310/335; 310/327; 310/334

(58) Field of Classification Search ................. 310/327, 310/334, 335

See application file for complete search history.

(56) References Cited

U.S. PATENT DOCUMENTS 4,374,172 A * 2/1983 Schwarz et al. .......... 428/308.4
4,595,515 A * 6/1986 Wakino et al. ................ 252/62
4,907,207 A 3/1990 Moeckl
5,648,941 A 7/1997 King
5,796,207 A * 8/1998 Safari et al. ................. 310/358
6,153,967 A 11/2000 Kobayashi et al.
2003/0125447 A1 7/2003 Hoch et al.
2005/0070801 A1 3/2005 Yamashita et al.
2005/0275313 A1 12/2005 Yamashita et al.
2006/0218763 A1* 10/2006 Jiles et al. .................. 29/25.35
2007/0016064 A1* 1/2007 Yamashita et al. .......... 600/459

FOREIGN PATENT DOCUMENTS

JP 60-68832 4/1985
JP 6-46497 2/1994
JP 07-059769 * 3/1995
JP 3420951 4/2003
JP 2003-265473 9/2003
JP 2003-339707 12/2003

OTHER PUBLICATIONS

U.S. Appl. No. 11/682,589, filed Mar. 6, 2007, Yamashita et al.
U.S. Appl. No. 11/477,470, filed Jun. 30, 2006, Yamashita et al.
U.S. Appl. No. 11/150,276, filed Jun. 13, 2005, Yamashita et al.
U.S. Appl. No. 11/223,969, filed Sep. 13, 2005, Hosono et al.

* cited by examiner

*Primary Examiner*—Thomas M Dougherty
(74) *Attorney, Agent, or Firm*—Oblon, Spivak, McClelland, Maier & Neustadt, P.C.

(57) ABSTRACT

Disclosed is an acoustic backing composition comprising an ethylene-vinyl acetate copolymer containing 20 to 80% by weight of the vinyl acetate units and a filler contained in the ethylene-vinyl acetate copolymer.

14 Claims, 5 Drawing Sheets

ACOUSTIC BACKING COMPOSITION, ULTRASONIC PROBE AND ULTRASONIC DIAGNOSTIC APPARATUS

CROSS-REFERENCE TO RELATED APPLICATIONS

This application is based upon and claims the benefit of priority from prior Japanese Patent Applications No. 2004-176333, filed Jun. 15, 2004; No. 2004-176334, filed Jun. 15, 2004; and No. 2005-161985, filed Jun. 1, 2005, the entire contents of all of which are incorporated herein by reference.

BACKGROUND OF THE INVENTION

1. Field of the Invention

The present invention relates to an acoustic backing composition, an ultrasonic probe comprising an acoustic backing member formed of the acoustic backing composition and serving to transmit-receive an ultrasonic signal to and from, for example, an object, and an ultrasonic diagnostic apparatus comprising the ultrasonic probe.

2. Description of the Related Art

A medical ultrasonic diagnostic apparatus or ultrasonic image inspecting apparatus transmits an ultrasonic signal to an object and receives an echo signal from within the object so as to form an image of the inside of the object. An array type ultrasonic probe capable of transmitting and receiving an ultrasonic signal is used mainly in these ultrasonic diagnostic and ultrasonic imaging apparatuses.

The ultrasonic probe comprises an acoustic lens and a piezoelectric element. In performing a medical diagnosis by using the ultrasonic probe, the piezoelectric element is driven under the state that the ultrasonic probe on the side of the acoustic lens contacts against an object so as to transmit an ultrasonic signal from the front surface of the piezoelectric element into the object. The ultrasonic signal is converged at a prescribed position within the object by the electronic focus function produced in accordance with the drive timing of the piezoelectric element and by the focus function produced by the acoustic lens. In this case, it is possible to transmit the ultrasonic signal within a prescribed area within the object by controlling the drive timing of the piezoelectric element, and the echo signal is received from the object and processed in the ultrasonic probe so as to obtain an ultrasonic image (tomographic image) within the prescribed range noted above. The ultrasonic signal is also released to the back surface by the driving of the piezoelectric element. Therefore, an acoustic backing member is arranged on the back surface of the piezoelectric element absorb (attenuate) the ultrasonic signal transmitted to the back surface, thereby avoiding a detrimental effect that the normal ultrasonic signal is transmitted into the object together with the ultrasonic signal (echo signal) reflected from the back surface.

The conventional acoustic backing member comprises an epoxy resin used as a base resin and a powdery material loaded as a filler in the base resin. A high density powder such as a tungsten (W) powder, a lead (Pb) powder or a zinc oxide (ZnO) powder is used as the powdery material loaded in the base resin. The acoustic backing member has a density of about 2.0 g/cm$^3$, a sound velocity of about 2,500 m/s, and an acoustic impedance of about 5 MRalys.

An acoustic backing member comprising a rubbery material used as a base resin such as a chloroprene rubber (CR), a butyl rubber or a urethane rubber and a powdery material having a high density such as W, Pb or ZnO, which is loaded as a filler in the base resin, is described in "Haifeng Wan et al., IEEE Transaction Ultrasonic Ferroelectrics and Frequency Control, vol. 48, No. 1, p. 78, 2001". The acoustic backing member described in this publication has a density of about 3.0 g/cm$^3$, an sound velocity of about 1,500 m/s and an acoustic impedance of about 5 MRalys.

Disclosed in Japanese Patents No. 3,420,951 and No. 3,420,954 are ultrasonic probes. One of these ultrasonic probes is constructed such that a sheet of a material having a high heat conductivity such as aluminum nitride, boron nitride, copper or carbon is arranged between the piezoelectric element and the acoustic backing member. The other ultrasonic probe comprises an acoustic backing member containing aluminum nitride, silicon carbide or copper as the filler. The ultrasonic probes disclosed in these patent documents permit efficiently releasing heat to the back surface of the piezoelectric element.

Disclosed in Japanese Patent Disclosure (Kokai) No. 60-68832 is an ultrasonic probe including a back surface layer exhibiting anisotropic acoustic characteristics. It is taught that the ultrasonic probe comprises metal fibers arranged on a synthetic resin such as an epoxy resin or an acrylic resin or on a compound material formed of rubber and that these metal fibers are aligned in the direction equal to the vibrating direction of a piezoelectric oscillator.

Further, an acoustic backing member formed of a preform and a matrix material is disclosed in Japanese Patent Disclosure No. 9-127955 (U.S. Pat. No. 5,648,941). It is taught that the preform denotes a linear fiber texture, a planar fiber texture such as a synthetic resin mesh sheet or a three dimensional fiber texture. It is also taught that the matrix material is used rubber and/or epoxy resin.

However, the acoustic backing member disclosed in each of the publications exemplified above gives rise to problems as pointed out below.

In preparing the ultrasonic probe, a piezoelectric element is bonded to an acoustic backing member, followed by bonding an acoustic matching layer to the piezoelectric element. Then, a dicing process is applied from the acoustic matching layer toward the acoustic backing member so as to divide the acoustic matching layer and the piezoelectric element into a plurality of arrayed sections, thereby forming a plurality of channels. Further, an acoustic lens is mounted to the acoustic matching layer for each channel. During the dicing process, grooves conforming with the diced portions are formed in the acoustic backing member. It is important to decrease the defective article ratio of the channels in order to improve the sensitivity in the ultrasonic probe of the particular construction. Also, in the ultrasonic diagnostic apparatus having an ultrasonic probe incorporated therein, it is important to decrease the defective article ratio of the channels in terms of the quality of the tomographic image. To be more specific, if the mechanical strength of the region between the adjacent grooves formed in the acoustic backing member is insufficient, the piezoelectric element included in the channel formed on the grooves is caused to collapse together with the acoustic backing member so as to make it impossible to use the channel.

The acoustic backing member described in each of the publications exemplified above comprises a base resin such as an epoxy resin or rubber such as a chloroprene rubber, a butyl rubber or an urethane rubber, and various fillers loaded in the base resin. The acoustic backing member of the particular construction is brittle, with the result that rupture or peeling is generated between the base resin and the filler by the stress during the dicing process. The rupture or peeling causes the acoustic backing member to be folded in the region between the adjacent grooves, or causes the peeling between the acoustic backing member and the piezoelectric element so as to bring about a defective channel. Particularly, where the dicing process is applied from the acoustic matching layer toward the acoustic backing member at a pitch of 50 to 200 μm in an attempt to reduce the channel size, to miniaturize the ultrasonic probe and to increase the density of the arrays, the folding of the acoustic backing member between the adjacent grooves and the peeling between the acoustic backing member and the piezoelectric oscillator are rendered more prominent by a large stress.

The peeling between the acoustic backing member and the piezoelectric oscillator can be improved to some extent by using an epoxy resin adhesive cured at a high temperature (120° C. or more) for bonding the acoustic backing member and the piezoelectric element. It should be noted, however, that, where a chloroprene rubber, a butyl rubber or a urethane rubber is used as the base material of the acoustic backing member, the acoustic backing member is deformed or denatured at the bonding temperature so as to render the bonding strength between the acoustic backing member and piezoelectric element insufficient after the bonding.

Also, in the acoustic backing member using a chloroprene rubber, a butyl rubber or a urethane rubber as the base resin, the performance of attenuating the ultrasonic wave is low. To be more specific, it is difficult to attenuate sufficiently the ultrasonic wave radiated from the piezoelectric element toward the acoustic backing member on the back surface. In order to allow the particular acoustic backing member to attenuate sufficiently the ultrasonic wave, it is necessary to increase the thickness of the acoustic backing member. However, if the thickness of the acoustic backing member is increased, it is difficult to decrease the weight and the heat dissipating properties of the ultrasonic probe.

BRIEF SUMMARY OF THE INVENTION

According to a first aspect of the present invention, there is provided an acoustic backing composition, comprising:

an ethylene-vinyl acetate copolymer containing 20 to 80% by weight of vinyl acetate units; and a filler contained in the ethylene-vinyl acetate copolymer.

According to a second aspect of the present invention, there is provided an ultrasonic probe comprising:

a plurality of channels arrayed forming spaces between the channels, and each having a piezoelectric element and an acoustic matching layer formed on the piezoelectric element;

a sheet-like acoustic backing member on which the piezoelectric elements are provided, and which have grooves formed in conformity with the spaces; and an acoustic lens formed on the acoustic matching layers;

wherein the acoustic backing member comprises an ethylene-vinyl acetate copolymer containing 20 to 80% by weight of the vinyl acetate units and a filler contained in the ethylene-vinyl acetate copolymer.

Further, according to a third aspect of the present invention, there is provided an ultrasonic diagnostic apparatus, comprising:

an ultrasonic probe comprising,

- a plurality of channels arrayed forming spaces between the channels, and each having a piezoelectric element and an acoustic matching layer formed on the piezoelectric element;
- a sheet-like acoustic backing member on which the piezoelectric elements are provided, and which have grooves formed in conformity with the spaces; and
- an acoustic lens formed on the acoustic matching layers;
- wherein the acoustic backing member comprises an ethylene-vinyl acetate copolymer containing 20 to 80% by weight of the vinyl acetate units and a filler contained in the ethylene-vinyl acetate copolymer, and an ultrasonic probe controller connected to the ultrasonic probe via a cable.

DETAILED DESCRIPTION OF THE INVENTION

Figure 1:
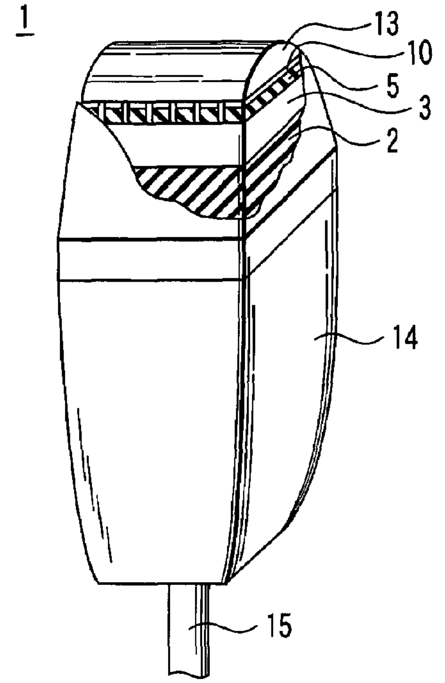
FIG. 1 is an oblique view schematically showing the construction of an ultrasonic probe according to an embodiment of the present invention.

Embodiments of the present invention will now be described in detail.

The acoustic backing composition according to the embodiment comprises a base resin of an ethylene-vinyl acetate copolymer (hereinafter referred to as EVA) containing 20 to 80% by weight of vinyl acetate units and a filler contained in EVA.

If the content of the vinyl acetate units in the base resin of EVA is lower than 20% by weight, the base resin of EVA itself is rendered brittle so as to make it difficult to mix a large amount of a filler in EVA. If the mixing amount of the filler is limited, it is difficult to achieve a prescribed value in each of the sound velocity and the acoustic impedance, i.e., the sound velocity of 1,500 to 4,000 m/s and an acoustic impedance of 2.0 to 8 MRalys. On the other hand, if the content of the vinyl acetate units exceeds 80% by weight, EVA is rendered excessively soft so as to bring about inconveniences in molding an acoustic backing member from the composition containing EVA and in polishing the surface of the molded acoustic backing member. It is more desirable for the content of the vinyl acetate units in EVA to fall within a range of 40 to 60% by weight.

The filler, which is contained in EVA in the form of, for example, fibers, unwoven fabrics, powders or flakes, serves to improve the mechanical strength and the heat dissipating properties of the acoustic backing member, to improve the attenuation rate of the ultrasonic wave, and to control the sound velocity.

It is possible to use various fibers as the filler including, for example, at least one fiber selected from the group consisting of a carbon fiber, a silicon carbide fiber and an alumina fiber. The fiber used in the embodiment is not limited to that formed of a single kind of material. For example, it is also possible to use a SiC fiber having its surface covered with a diamond film or a resin film by the CVD method.

Among the fibers, it is particularly desirable to use a carbon fiber. It is possible to use carbon fibers of various grades such as a pitch series carbon fiber and a PAN series carbon fiber. It is also possible to use carbon nano tubes as the carbon fiber. Particularly, it is desirable to use a pitch series carbon fiber having a density of 2.1 g/cm$^3$ or more and a heat conductivity of 100 W/mK or more.

It is desirable for the carbon fiber to have a diameter of 20 μm or less and a length of five times or more of the diameter. An acoustic backing member formed of an acoustic backing composition containing fibers having an average diameter of 20 μm or less serves to suppress the reflection from the piezoelectric element in each channel mounted to the acoustic backing member. It is also possible to achieve a sufficient mechanical strength required during the dicing process. On the other hand, the acoustic backing member formed of an acoustic backing composition containing fibers having a length of five times or more of the diameter permits further improving the heat dissipating properties. For example, where the particular acoustic backing member is applied to an abdominal probe for 2 to 5 MHz requiring a thickness of 4 mm or more, the heat can be effectively dissipated in the acoustic backing member. It is more desirable that an upper limit of length of the fiber is 500 times.

The powdery filler and the flake-like filler include at least one inorganic material selected from the group consisting of zinc oxide, zirconium oxide, aluminum oxide, silicon oxide, titanium oxide, silicon carbide, aluminum nitride and boron nitride. It is desirable for the powdery filler to have an average particle diameter of 30 μm or less, more preferably 20 μm or less.

It is desirable for the filler to be contained in EVA in an amount of 20 to 70% by volume based on the sum of EVA and the filler. If the filler content is lower than 20% by volume, it is difficult to effectively improve the mechanical strength, the heat dissipating properties, the attenuation rate and the sound velocity of the acoustic backing member formed of the resultant acoustic backing composition. On the other hand, if the filler content exceeds 70% by volume, it is difficult to knead the filler in the base resin of EVA, with the result that it is difficult to use the resultant acoustic backing composition for forming an acoustic backing member having a desired shape. It is more desirable for the filler content (i.e., the amount of the filler based on the sum of EVA and the filler) to fall within a range of 40 to 60% by volume.

It is acceptable for the acoustic backing composition according to an embodiment to further contain a powder of at least one metal selected from the group consisting of tungsten (W), molybdenum (Mo) and silver (Ag). The acoustic backing member formed of an acoustic backing composition containing the metal powder noted above has a higher density so as to make it possible to further improve the attenuation rate of the ultrasonic wave. It is desirable for the metal powder content, i.e., the amount of the metal powder based on the sum of EVA, the filler and the metal powder, to be 10% by volume or less.

It is also acceptable for the acoustic backing composition according to an embodiment to further contain a vulcanizing agent, a vulcanization promoter, a lubricant such as carnauba wax, a deterioration preventive and a silicone resin.

The acoustic backing composition for the embodiment described above is used mainly as the raw material of the acoustic backing member for an ultrasonic probe including a one-dimensional array type piezoelectric element described herein later. The acoustic backing composition is also used as the raw material of the acoustic backing member used for manufacturing an ultrasonic probe including a two dimensional array type piezoelectric element or for manufacturing a single element ultrasonic probe.

The construction of an ultrasonic probe comprising a sheet-like acoustic backing member formed of the acoustic backing composition described above will now be described with reference to the accompanying drawings.

Figure 2:
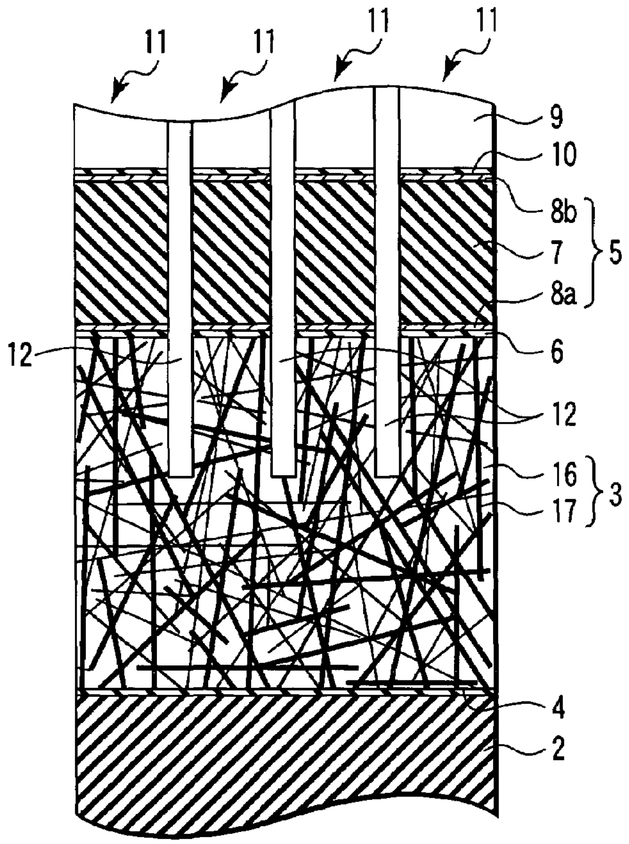
FIG. 2 is a cross sectional view showing the construction in the peripheral portion of the piezoelectric element included in the ultrasonic probe shown in FIG. 1.

FIG. 1 is an oblique view, partly broken away, showing the construction of an ultrasonic probe according to an embodiment, and FIG. 2 is a cross sectional view showing the construction in the gist portion of the ultrasonic probe shown in FIG. 1.

An ultrasonic probe 1 comprises a supporting base 2. A sheet-like acoustic backing member 3 is fixed to the supporting base 2 with an insulating adhesive layer 4 interposed therebetween. The insulating adhesive layer 4 is formed of, for example, an epoxy resin series adhesive and has a thickness of 20 to 200 μm. A plurality of channels 11, which are arrayed forming spaces of desire width between the channels, are fixed to the acoustic backing member 3 with an insulating adhesive layer 6 interposed therebetween. The channels 11 have spaces of desire width between the channels. The insulating adhesive layer 6 is formed of, for example, an epoxy resin series adhesive and has a thickness of 20 to 200 μm. Each of the channels 11 comprises a piezoelectric element 5 provided the insulating adhesive layer 6 and having an piezoelectric body 7 and first and second electrodes 8*a*, 8*b* formed on both surfaces of the piezoelectric body 7, and an acoustic matching layer 9 fixed to the second electrode 8*b* of the piezoelectric element 5 with an insulating adhesive layer 10 interposed therebetween. The insulating adhesive layer 10 is formed of an epoxy resin series adhesive and has a thickness of, for example, 2.0 to 200 μm. Grooves 12 are formed in the acoustic backing member 3 in a manner to conform with the spaces between the channels 11. Further, an acoustic lens 13 is fixed to the acoustic matching layer 9 in each of the channels 11 with an insulating adhesive layer (not shown), which is formed of, for example, a silicone resin, interposed there between.

The supporting base 2, the acoustic backing member 3, the channels 11 and the acoustic lens 13 are housed in a case 14. Also housed in the case 14 may be a signal processing circuit (not shown) including a control circuit for controlling the drive timing of the piezoelectric element 5 of each of the plurality channels 11 and an amplifying circuit for amplifying the signal received by the piezoelectric element 5. A cable 15 connected to the first and second electrodes 8*a*, 8*b* extends to the outside of the case 14 from the side opposite to the acoustic lens 13.

In the ultrasonic probe of the construction described above, voltage is applied between the first electrode 8*a* and the second electrode 8*b* of the piezoelectric element 5 included in each of the channels 11 so as to permit the piezoelectric body 7 to resonate and, thus, to radiate (transmit) an ultrasonic wave through the acoustic matching layer 9 and the acoustic lens 13. In the receiving stage, the piezoelectric body 7 is vibrated by the ultrasonic wave received through the acoustic lens 13 and the acoustic matching layer 9. Then, the vibration is electrically converted into signals so as to obtain an image.

In the ultrasonic probe of the construction described above, the supporting base is formed of, for example, a material having a small deformation and a high hardness. It is possible to promote the heat dissipating properties from the acoustic backing member by using a metal or a ceramic material having a high heat conductivity for forming the supporting base 2.

In the ultrasonic probe of the construction described above, the acoustic backing member 3 is formed of the acoustic backing composition described previously. As shown in FIG. 2, the acoustic backing member 3 comprises a base resin 16 formed of an ethylene-vinyl acetate copolymer (EVA) containing 20 to 80% by weight of the vinyl acetate units and a filler (e.g., fiber) 17 contained in the base resin 16.

The filler used in the acoustic backing member is contained in the base resin of EVA in the form of a unwoven fabric, a power or flakes instead of the fiber referred to above. Also, it is acceptable for the filler to include the fiber together with a powdery or flakey inorganic material.

It is possible to use various fibers as the filler including, for example, at least one fiber selected from the group consisting of a carbon fiber, a silicon carbide fiber and an alumina fiber. The fiber is not limited to that formed of a single kind of the material. For example, it is also possible to use a SiC fiber subjected to CVD method for covering the surface with a diamond film or a resin film. It is desirable for the fiber to have a diameter of 20 μm or less and a length of five times or more of the diameter in order to improve the mechanical strength and the heat dissipating properties of the acoustic backing member and to improve the attenuation rate of the ultrasonic wave.

Among the fibers, it is particularly desirable to use a carbon fiber. It is possible to use carbon fibers of various grades such as a pitch series carbon fiber and a PAN series carbon fiber. It is also possible to use carbon nano tubes as the carbon fiber. Particularly, it is desirable to use a pitch series carbon fiber having a density of 2.1 g/cm$^3$ or more and a heat conductivity of 100 W/mK or more.

The powdery filler and the flakey filler include at least one inorganic material selected from the group consisting of zinc oxide, zirconium oxide, aluminum oxide, silicon oxide, titanium oxide, silicon carbide, aluminum nitride and boron nitride. Particularly, the powder or flakes of at least one inorganic material selected from the group consisting of aluminum nitride and boron nitride exhibits an excellent heat conductivity and, thus, makes it possible to provide an acoustic backing member exhibiting further improved heat dissipating properties.

It is desirable for the filler to be contained in the base resin of EVA in an amount of 20 to 70% by volume, preferably 40 to 60% by volume, for the reasons described previously.

Particularly, it is desirable for the fibers having a diameter of 20 μm or less and a length of five times or more of the diameter to be loaded in the acoustic backing member in an amount of 20 to 70% by volume. It is also desirable for 20 to 80% by volume of the loaded fibers to be aligned at an angle of 30° or less relative to the axis in the thickness direction of the acoustic backing member.

It is acceptable for the powder of at least one metal selected from the group consisting of tungsten, molybdenum and silver, e.g., a metal powder in an amount of 10% by volume or less, to be further loaded in the acoustic backing member.

It is desirable for the acoustic backing member to have a density of 2.0 g/cm$^3$ or less. Particularly, it is desirable for the acoustic backing member to have an acoustic impedance of 2 to 8 MRalys, a heat conductivity of 5 W/mK or more, and a density of 2.0 g/cm$^3$ or less.

It is acceptable to arrange a shield of a metal such as copper or silver on the side surface of the acoustic backing member so as to further improve the heat dissipating properties of the acoustic backing member. Also, it is acceptable to connect the acoustic backing member to the ground electrode line or shield line of the cable connected to the signal electric terminal or the ground electric terminal so as to promote the heat dissipating properties from the backing material.

The piezoelectric body is formed of, for example, a PZT series or relaxor series piezoelectric ceramic material or a relaxor series single crystal.

The first and second electrodes are formed by, for example, baking a paste containing a powder of gold, silver or nickel to both surfaces of the piezoelectric body, by forming a gold, silver or nickel layer on both surfaces of the piezoelectric body by the sputtering method, or by plating a gold, silver or nickel layer to both surfaces of the piezoelectric body.

The acoustic matching layer is formed of a material containing, for example, an epoxy resin as a base material. The acoustic matching layer is not limited to a single layer structure. It is also possible to use an acoustic matching layer of a multi-layered structure.

The acoustic lens is formed of, for example, a silicone series material.

The method of manufacturing the acoustic backing member will now be described with reference to FIGS. 3A to 3D.

Figure 3A:
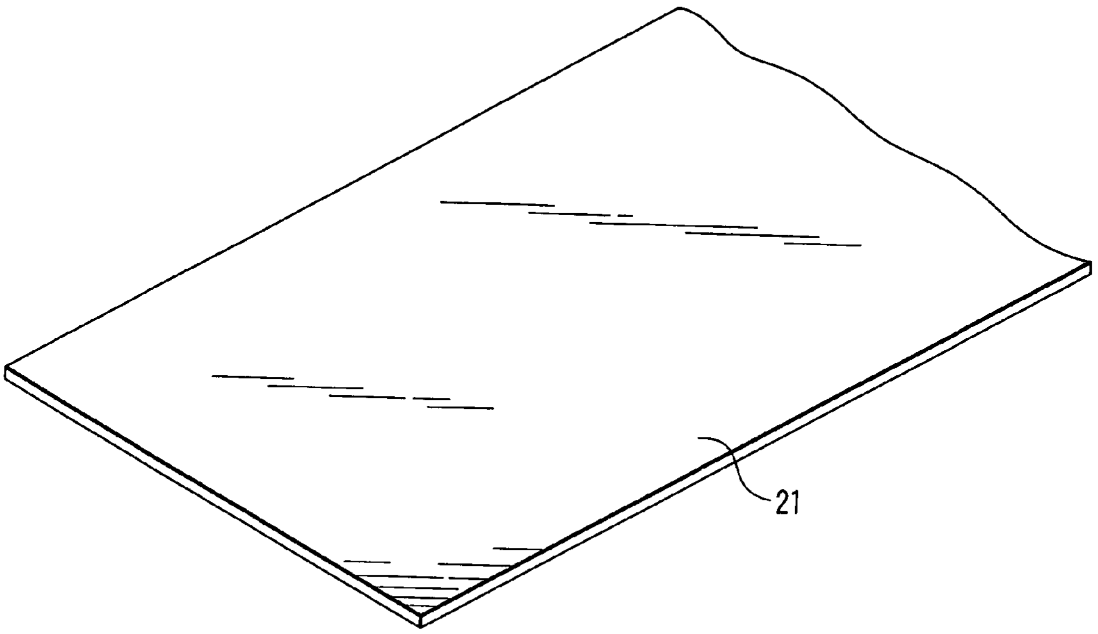
FIGS. 3A to 3D are cross sectional views collectively showing the process of manufacturing an acoustic backing member according to an embodiment of the present invention.
Figure 3B:
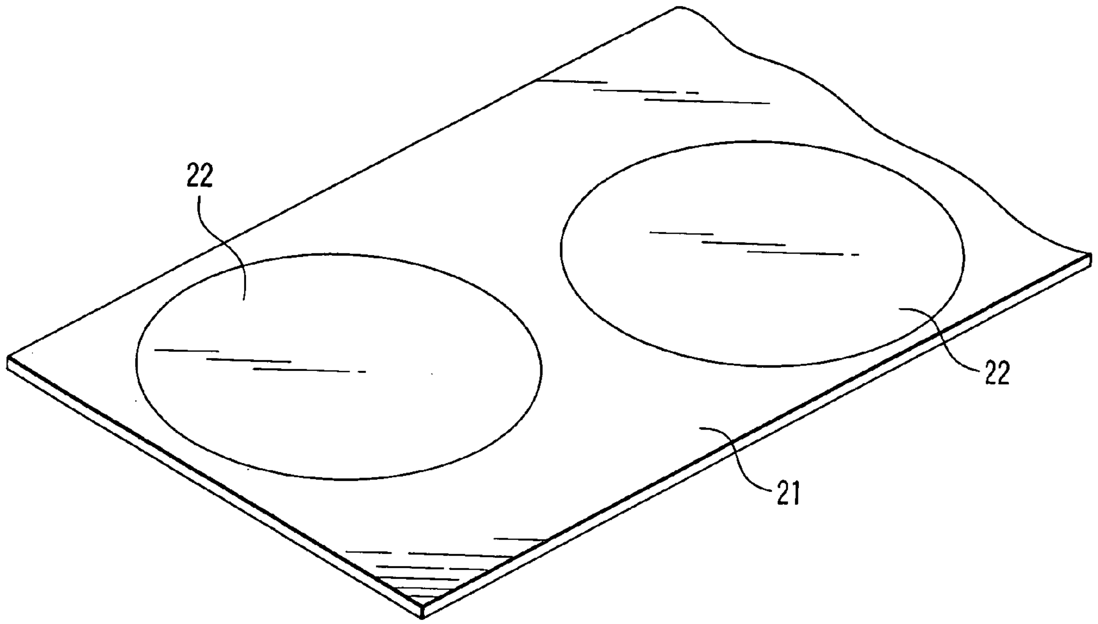
Figure 3C:
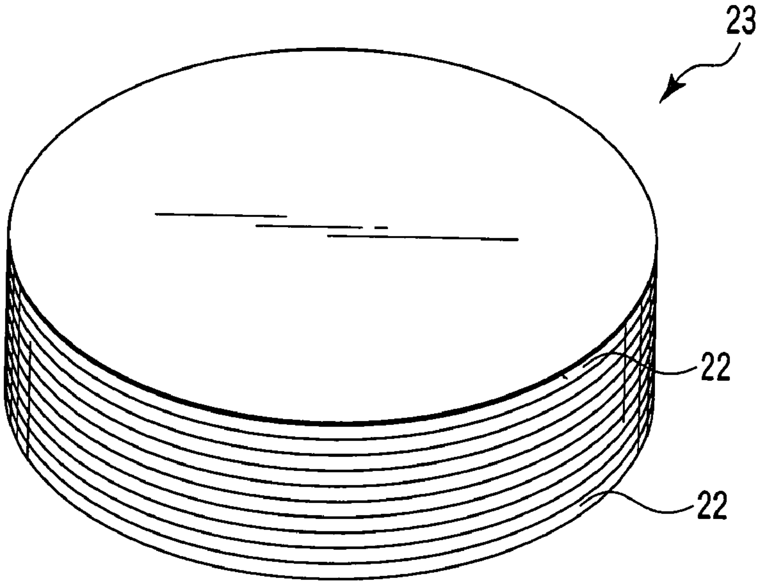
Figure 3D:
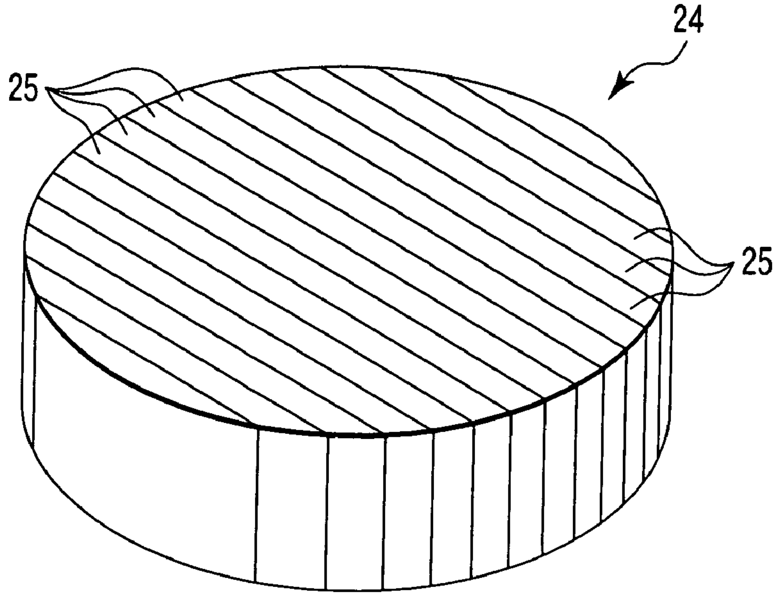

In the first step, the base resin of EVA containing 20 to 80% by weight of the vinyl acetate units is introduced into the clearance between two heat rolls so as to knead the base resin of EVA, followed by adding, for example, a vulcanizing agent and a vulcanization promoter to the base resin of EVA and kneading the resultant mixture so as to form a sheet 21 as shown in FIG. 3A. It is desirable for the sheet 21 to have a thickness of 0.5 to 1.0 mm. Then, the sheet 21 is punched so as to form a plurality of circular sheets 22 as shown in FIG. 3B, followed by laminating the circular sheets 22 obtained by the punching one upon the other so as to form a laminate structure 23 as shown in FIG. 3C. Further, the laminate structure 23 is heated to 120 to 180° C. so as to permit the circular sheets 22 to be bonded to each other by vulcanization (crosslinking), thereby obtaining a circular block having a thickness of 10 to 30 mm, as shown in FIG. 3D. The circular block 24 thus obtained is diced into a plurality of sections in a direction perpendicular to the circular surface so as to manufacture a plurality of sheet-like acoustic backing members 25.

Particularly, in the manufacturing method described above, it is desirable to use an acoustic backing composition containing the base resin of EVA and 20 to 70% by volume of fibers (e.g., carbon fibers) having a diameter of 20 μm or less and a length of five times or more of the diameter. In this case, it is possible to obtain a sheet-like acoustic backing member in which 20 to 80% by volume of the loaded fibers are aligned at an angle of 30° or less relative to the axis in the thickness direction of the acoustic backing member.

The manufacturing method of the ultrasonic probe described previously will now be described with reference to FIGS. 4A and 4B.

Figure 4A:
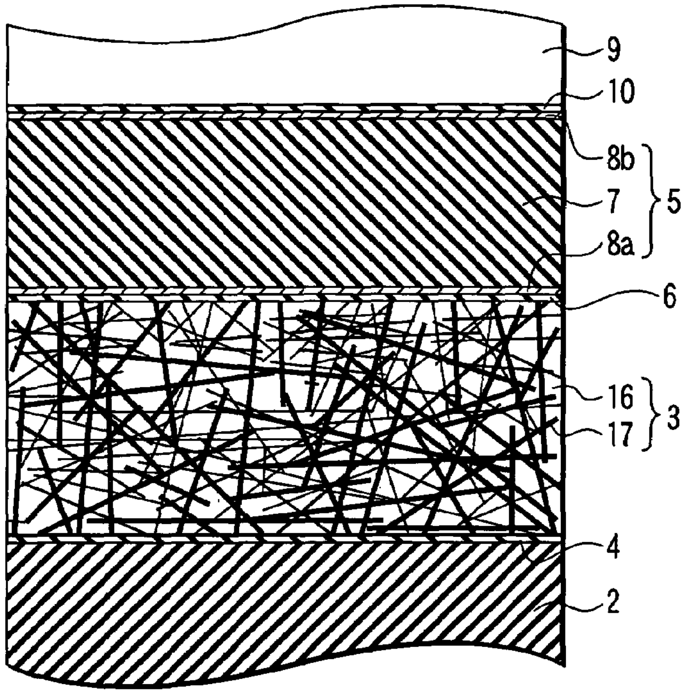
FIGS. 4A and 4B are cross sectional views collectively showing the manufacturing process of an ultrasonic probe according to an embodiment of the present invention.
Figure 4B:
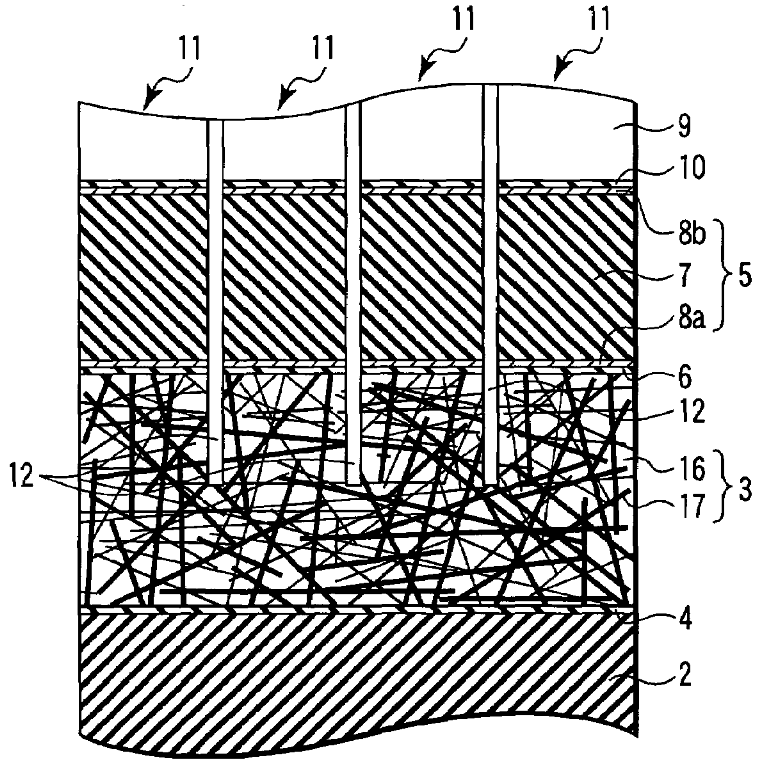

In the first step, the acoustic backing member 3, the piezoelectric element 5, and the acoustic matching layer 9 are laminated one upon the other in the order mentioned on the supporting base 2, as shown in FIG. 4A, with epoxy resin series adhesive layers 4, 6 and 10 interposed between the adjacent laminated members, so as to obtain a laminate structure. The acoustic backing member 3 is manufactured by, for example, the method shown in FIGS. 3A to 3D. Then, the laminate structure is heated at, for example, 120° C. for about one hour so as to cure the epoxy resin series adhesive, thereby achieving a fixed bonding between the supporting base 2 and the acoustic backing member 3, between the acoustic backing member 3 and the piezoelectric element 5, and between the piezoelectric element 5 and the acoustic matching layer 9 by the insulating adhesive layers 4, 6 and 10, respectively.

In the next step, the laminate structure is diced by using a diamond saw from the acoustic matching layer 9 toward the acoustic backing member 3 at a width (pitch) of, for example, 50 to 200 μm so as to divide the laminate structure into a plurality of arrayed sections, thereby forming a plurality of channels 11 each including the piezoelectric element 5 and the acoustic matching layer 9. In this stage, grooves 12 are formed in the acoustic backing member 3 in a manner to conform with the spaces between the channels 11. Then, an acoustic lens (not shown) is bonded to the acoustic matching layer 9 in each channel 11 with a silicone series adhesive, and the acoustic backing member 3 including the supporting base 2, the channels 11 and the acoustic lens are housed in a case so as to manufacture an ultrasonic probe.

Figure 5:
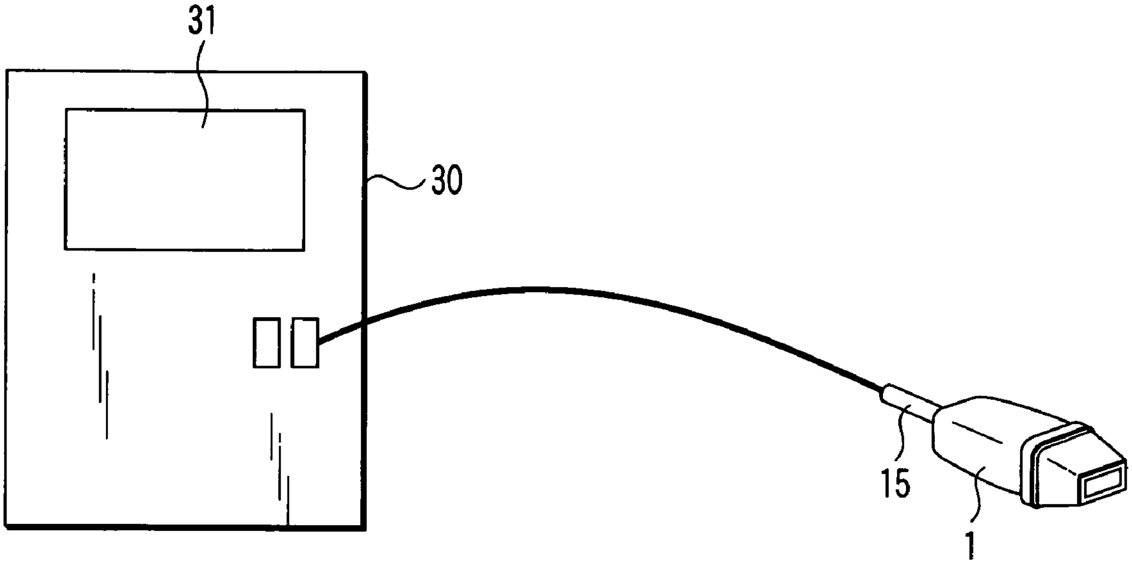
FIG. 5 schematically shows the construction of an ultrasonic diagnostic apparatus according to an embodiment of the present invention.

An ultrasonic diagnostic apparatus provided with the ultrasonic probe will now be described with reference to FIG. 5. It should be noted that a medical ultrasonic diagnostic apparatus (or an ultrasonic image inspecting apparatus), which transmits an ultrasonic signal to an object and receives an echo signal reflected from the object so as to form an image of the object, comprises an arrayed ultrasonic probe 1 capable of transmitting/receiving an ultrasonic signal. The acoustic backing member of the composition described previously is incorporated in the ultrasonic probe 1. As shown in the drawing, the ultrasonic probe 1 is connected to an ultrasonic diagnostic apparatus body 30 via a cable 15. A display 31 is mounted to the ultrasonic diagnostic apparatus body 30.

As described above, the acoustic backing composition according to the embodiment described above contains the base resin of EVA containing 20 to 80% by weight of the vinyl acetate units. EVA containing a prescribed amount of the vinyl acetate units permits a high attenuation rate of the ultrasonic wave. Also, EVA not containing a filler permits an sound velocity of about 1,500 m/s. Further, a relatively large proportion of filler can be mixed with the base resin of EVA so as to improve the mechanical strength of the EVA composition. Also, EVA exhibits a relatively high heat resistance. The acoustic backing member formed of an acoustic backing composition prepared by allowing the base resin of EVA of the particular properties to contain a filler exhibits an sound velocity of 1,500 to 4,000 m/s. The sound velocity can be improved to 2,000 to 4,000 m/s depending on the kind and the loaded amount of the fillers. It follows that the acoustic backing member permits setting the acoustic impedance at 2.0 to 8 MRalys even under a low density of 1.0 to 2.5 g/cm$^3$. Also, the acoustic backing member achieves a high attenuation rate (e.g., an attenuation rate of 3.0 to 6.0 dB/mm MHz under the measuring frequency of 1-3 MHz), compared with the conventional acoustic backing member prepared by loading a powdery material of W, Pb, or ZnO at a high density in a rubbery material. It follows that, even if the thickness of the acoustic backing member is decreased, the ultrasonic signal generated by driving the piezoelectric element can be sufficiently absorbed and attenuated on the back surface side. As a result, it is possible to obtain a small ultrasonic probe including a thin acoustic backing member.

Since the attenuation rate can be further increased to, for example, 4.0 to 6.0 dB/mm MHz under the measuring frequency of 1 to 3 MHz by using fibers as the filler, the thickness of the acoustic backing member can be further decreased. Particularly, since the attenuation rate can be further improved by using a carbon fiber as the filler, it is possible to further decrease the thickness of the acoustic backing member.

It should also be noted that the acoustic backing member formed of the acoustic backing composition described previously exhibits a high mechanical strength. In addition, the base resin of EVA used in the acoustic backing composition exhibits a relatively high heat resistance. It follows that the acoustic backing member can be strongly bonded to the piezoelectric element by using an epoxy resin series adhesive exhibiting a high bonding strength. To be more specific, where the acoustic backing member and the piezoelectric element are bonded to each other by using an epoxy resin series adhesive, the adhesive is heated to 120° C. or higher for the curing purpose. The rubber used in the conventional acoustic backing member such as, a chloroprene rubber, a butyl rubber or a urethane rubber is deformed or denatured under the temperature noted above so as to make insufficient the bonding strength between the acoustic backing member after the bonding and the piezoelectric element. On the other hand, the base resin of EVA has a relatively high heat resistance so as to withstand the curing temperature noted above. As a result, it is possible to bond the piezoelectric element to the acoustic backing member formed of the acoustic backing composition containing the base resin of EVA by using an epoxy resin series adhesive without bringing about a thermal change of properties. In addition, the bonding strength can be maintained even after the bonding. It should be noted in this connection that, as described previously, the piezoelectric element is bonded to the acoustic backing member with an epoxy resin series adhesive, followed by bonding an acoustic matching layer to the piezoelectric element so as to form a laminate structure. Then, a dicing process is applied to the laminate structure from the acoustic matching layer toward the acoustic backing member at a pitch of, for example, 50 to 200 μm so as to divide the laminate structure consisting of the acoustic matching layer and the piezoelectric element into a plurality of arrayed sections, thereby forming a plurality of channels. What should be noted is that, since a high bonding strength is maintained between the acoustic backing member and the piezoelectric element as pointed out above, it is possible to prevent the peeling between the acoustic backing member and the piezoelectric element in the step of forming the plural channels. Also, since the base resin of EVA and the filler are strongly bonded to each other in the acoustic backing member itself, it is also possible to prevent ruptures or peeling between EVA and the filler contained in the base resin during the dicing process. It follows that it is possible to suppress or prevent the defective channel formation during the dicing process so as to make it possible to obtain an ultrasonic probe of a high sensitivity having a plurality of channels. Further, it is possible to permit an ultrasonic diagnostic apparatus having the ultrasonic probe incorporated therein to achieve an improvement in the quality of the tomographic image.

Further, it is possible for the acoustic backing composition used in the embodiment to contain a filler having a high conductivity, such as aluminum nitride, a boron nitride powder or a carbon fiber. The acoustic backing member formed of the particular acoustic backing composition exhibits further improved heat dissipating properties. It follows that, in the ultrasonic probe comprising the particular acoustic backing member, the heat generated by the piezoelectric element or the heat generated by the multiple reflection of the ultrasonic wave can be radiated efficiently to the outside. As a result, it is possible to increase the signal transmitting voltage in the ultrasonic diagnostic apparatus having the particular ultrasonic probe incorporated therein so as to make it possible to increase the range of the diagnostic region that can be observed. For example, a deep portion of the human body can be observed. Particularly, carbon fiber exhibits an excellent heat conductivity and has a directivity of the heat transmission within the acoustic backing member. It follows that, in the ultrasonic probe comprising the particular acoustic backing member, the heat generated in the piezoelectric element or the heat generated by the multiple reflection of the ultrasonic wave can be radiated more efficiently to the outside.

Thus, the acoustic backing composition according to an embodiment makes it possible to obtain an acoustic backing member that is lightweight and thin and to obtain an ultrasonic probe of a high sensitivity. Also, the ultrasonic diagnostic apparatus having the particular ultrasonic probe incorporated therein permits improving the quality of the tomographic image. Further, it is possible to maintain a low temperature on the surface of the ultrasonic probe comprising the particular acoustic backing member by selecting a filler having a high heat conductivity such as aluminum nitride, a boron nitride powder or a carbon fiber. In the ultrasonic diagnostic apparatus having the particular ultrasonic probe incorporated therein, it is possible to increase the range of the diagnostic region that can be observed. For example, a deep region of the human body can be observed.

Particularly, it is possible to obtain an acoustic backing member of a high performance satisfying the characteristics described above by selecting a carbon fiber (particularly, a carbon fiber having a diameter of 20 μm or less and a length of five times or more of the diameter) as a filler contained in the acoustic backing composition.

Also, it is possible to further improve the characteristics of the acoustic backing member by allowing the acoustic backing member loaded with a filler such as a carbon fiber to be constructed as follows.

Specifically, in the acoustic backing member 3, the loaded fibers 17 are positioned partly in the region having a low mechanical strength between the adjacent grooves 12 and the region having a low mechanical strength between the groove 12 and the side surface, as shown in FIG. 2. Since the fibers 17 are positioned in the regions having a low mechanical strength between adjacent grooves 12 and between the groove 12 and the side surface, it is possible to increase the mechanical strength of the acoustic backing member 3. As a result, it is possible to prevent the acoustic backing member 3 from collapsing in the regions between the adjacent grooves 12 and between the groove 12 and the side surface during the dicing process for forming the channels 11. It follows that it is possible to effectively prevent the defective channel formation during the dicing process.

It is possible for the acoustic backing member to achieve a high ultrasonic wave attenuation rate by utilization of fibers having a diameter of 20 μm or less and a length of 5 times or more of the diameter and by arranging the fibers such that 20 to 80% by volume of the fibers contained in the acoustic backing member are aligned at an angle of 30° or less relative to the axis in the thickness direction of the acoustic backing member. To be more specific, the ultrasonic wave generated from the piezoelectric element 5 is radiated not only to the acoustic lenses 11 on the entire surface but also to the acoustic backing member 3 on the back surface, as shown in FIG. 2. It should be noted that, if a reasonable amount of the fibers contained in the acoustic backing member 3 are aligned in the thickness direction of the acoustic backing member, i.e., aligned in the propagating direction of the ultrasonic wave, an amazing effect can be produced such that the ultrasonic wave is effectively attenuated while being transmitted through the fibers, with the result that the attenuation rate of the ultrasonic wave can be further improved. Particularly, the attenuation rate can be further improved in the case of selecting a carbon fiber as the fiber loaded in the acoustic backing composition.

It should also be noted that the mechanical strength in the thickness direction can be balanced with that in the planar direction depending on the arrangement of the carbon fibers loaded in the acoustic backing member of the construction specified in the embodiment, so as to make it possible to moderate satisfactorily the stress during the dicing process and, thus, to prevent the occurrence of cracks. As a result, it is possible to effectively prevent the defective channel formation.

Further, the acoustic backing member of the construction specified in the embodiment permits further improving the heat dissipating properties. Particularly, the heat dissipating properties can be further improved prominently by selecting the carbon fiber as the fiber loaded in the acoustic backing composition.

What should also be noted is that it is possible to effectively prevent the acoustic backing member from being broken in the regions between the adjacent grooves and between the groove and the side surface by allowing the fibers to be partly positioned in the regions between the adjacent grooves and between the groove and the side surface in the acoustic backing member having the arrangement of the fibers such as the carbon fiber specified therein. As a result, it is possible to effectively prevent defective channel formation during the dicing process.

Some Examples of the present invention will now be described in detail.

EXAMPLE 1

A base resin of an ethylene-vinyl acetate copolymer (EVA) containing 50% by weight of the vinyl acetate units was supplied into a clearance between heat rolls heated to about 70° C. so as to carry out a preliminary kneading for 20 minutes. Then, added to 100 parts by weight of the base resin of EVA subjected to the preliminary kneading were a glass fiber (filler) having an average diameter of 15 μm and an average length of 20 mm, 6 parts by weight of dioctyl sebacate (vulcanizing agent), 2 parts by weight of zinc stearate (vulcanization promoter), 4 parts by weight of carnauba wax and 3 parts by weight of a silicone resin, followed by further kneading the resultant composition and subsequently forming the kneaded composition into a sheet for 20 minutes so as to obtain a resin composition sheet having a width of 400 mm and a thickness of 0.5 mm. Incidentally, the glass fiber was mixed in the kneaded material in an amount of 70% by volume. Then, the sheet was punched so as to obtain circular discs each having a diameter of 100 mm, followed by laminating 40 circular discs one upon the other so as to obtain a laminate structure. The laminate structure thus obtain was put into a mold and heated at 180° C. for 15 minutes under a pressurized condition so as to achieve vulcanization, thereby obtaining a circular block having a diameter of 100 mm and a thickness of 20 mm. Further, the circular block was sliced in a direction perpendicular to the circular surface at a pitch of 3 mm so as to obtain sliced pieces each having a length of 50 to 100 mm, a width of 20 mm and a thickness of 3 mm. A sliced piece having a length of 80 mm was selected as an acoustic backing member for evaluation. The acoustic backing member was found to have a construction that 25% by volume of the loaded glass fibers were aligned at an angle of 30° or less relative to the axis in the thickness direction of the acoustic backing member.

EXAMPLES 2 TO 7

Six kinds of acoustic backing members for evaluation were prepared as in Example 1, except that the amounts of the vinyl acetate units contained in the base resin of EVA and the fillers used were as shown in Table 1. Incidentally, each of the $ZrO_2$ powder and the ZnO powder used as fillers had an average particle diameter of 15 μm, and each of the SiC fiber and the $Al_2O_3$ fiber used had a diameter of 15 μm and a length of 20 mm. Also, 25% by volume of the loading amounts of the SiC fiber and the $Al_2O_3$ fiber in the acoustic backing member for evaluation were aligned at an angle of 30° or less relative to the axis in the thickness direction of the acoustic backing member.

COMPARATIVE EXAMPLES 1 TO 5

Five kinds of acoustic backing members for evaluation each having a length of 80 mm, a width of 20 mm and a thickness of 3 mm were obtained by slicing as in Example 1 circular blocks each having a diameter of 100 mm and a thickness of 20 mm. To be more specific, the acoustic backing member for Comparative Example 1 was obtained by slicing a circular block comprising an epoxy resin containing 30% by volume of $Al_2O_3$ fibers having a diameter of 15 μm and a length of 20 mm. The acoustic backing member for Comparative Example 2 was obtained by slicing a circular block comprising a chloroprene rubber (CR) containing $Al_2O_3$ fibers of the same size. The acoustic backing member for Comparative Example 3 was obtained by slicing a circular block comprising an isoprene rubber (IR) containing $Al_2O_3$ fibers of the same size. The acoustic backing member for Comparative Example 4 was obtained by slicing a circular block comprising a normal butadiene rubber (NBR) containing $Al_2O_3$ fibers of the same size. Further, the acoustic backing member for Comparative Example 5 was obtained by slicing a circular block comprising an urethane resin containing $Al_2O_3$ fibers of the same size.

The density, the sound velocity, the acoustic impedance (AI), the attenuation rate, the heat conductivity, and the defective channel ratio were measured for each of the acoustic backing members for evaluation for Examples 1 to 7 and Comparative Examples 1 to 5.

The density value was obtained using a circular block.

For determining each of the sound velocity and the attenuation rate, an acoustic backing member for evaluation was subjected to measurement by an underwater method at 25° C. by using a probe (measuring frequency of 1.0 to 3.0 MHz).

The acoustic impedance (AI) denotes a product obtained by multiplying the measured sound velocity by the density.

The heat conductivity was measured by a laser flash method.

Further, the defective channel ratio was measured as follows. Specifically, a piezoelectric element and an epoxy resin-based acoustic matching layer were laminated one upon the other on an acoustic backing member for evaluation with an epoxy resin series adhesive interposed between the acoustic backing member and the piezoelectric element and between the piezoelectric element and the acoustic matching layer, followed by heating the laminate structure at 120° C. for about one hour for curing the adhesive so as to achieve bonding of the laminate structure. Then, a dicing process was applied at a width of 50 μm and to a cutting depth into the acoustic backing member of 200 μm from the acoustic matching layer toward the acoustic backing member for evaluation, so as to form 2 columns of channels, each column consisting of 200 channels, i.e., the sum of 400 channels. The signal intensity of the piezoelectric element for each channel was measured, and the defective channel ratio was determined from the 400 channels on the basis that the channel, in which the signal intensity of the piezoelectric element was lowered by at least 20% from the initial design value, was counted as the defective channel. Incidentally, the piezoelectric element used was constructed such that first and second electrodes each made of Ni were formed on both surfaces of a PZT series piezoelectric ceramic body (piezoelectric body).

Table 1 shows the results. The composition of the acoustic backing member for evaluation is also shown in Table 1.

TABLE 1

| | Composition of acoustic backing member | | | | |
|---|---|---|---|---|---|
| | Base resin | | Filler | | Density of acoustic backing member ($g/cm^3$) |
| | Type | Density ($g/cm^3$) | Type | Amount (vol %) | |
| Example 1 | EVA: 60/40 | 0.87 | Glass fiber | 70 | 2.36 |
| Example 2 | EVA: 60/40 | 0.87 | $ZrO_2$ powder | 30 | 2.31 |
| Example 3 | EVA: 60/40 | 0.87 | ZnO powder | 30 | 2.29 |
| Example 4 | EVA: 50/50 | 0.88 | SiC fiber | 50 | 2.04 |
| Example 5 | EVA: 40/60 | 0.89 | SiC fiber | 40 | 1.81 |
| Example 6 | EVA: 30/70 | 0.91 | $Al_2O_3$ fiber | 30 | 1.81 |
| Example 7 | EVA: 20/80 | 0.93 | $Al_2O_3$ fiber | 20 | 1.52 |
| Comparative Example 1 | Epoxy | 1.10 | $Al_2O_3$ fiber | 30 | 1.94 |
| Comparative Example 2 | CR | 1.24 | $Al_2O_3$ fiber | 30 | 2.04 |
| Comparative Example 3 | IR | 1.10 | $Al_2O_3$ fiber | 30 | 1.94 |
| Comparative Example 4 | NBR | 1.10 | $Al_2O_3$ fiber | 30 | 1.94 |
| Comparative Example 5 | Urethane | 0.96 | $Al_2O_3$ fiber | 30 | 1.84 |

| | Characteristics of acoustic backing member | | | | |
|---|---|---|---|---|---|
| | Acoustic velocity (m/s) | AI (MRayls) | Attenuation rate (dB/mm MHz) | Heat conductivity (W/mk) | Defective channel ratio (%) |
| Example 1 | 3358 | 7.9 | 3.1 | 1 | 0 |
| Example 2 | 1350 | 3.1 | 3.7 | 0.9 | 0 |
| Example 3 | 1400 | 3.2 | 3.8 | 1.8 | 0 |
| Example 4 | 2320 | 4.7 | 4.5 | 3.9 | 0 |
| Example 5 | 2120 | 3.8 | 4.8 | 3.3 | 0 |

TABLE 1-continued

| | | | | | |
|---|---|---|---|---|---|
| Example 6 | 1950 | 3.5 | 4.4 | 2.9 | 0 |
| Example 7 | 1700 | 2.6 | 4.2 | 1.9 | 0 |
| Comparative Example 1 | 2700 | 5.2 | 0.96 | 2.9 | 25 |
| Comparative Example 2 | 2000 | 4.1 | 1.9 | 2.8 | 8 |
| Comparative Example 3 | 2050 | 4.0 | 1.8 | 2.8 | 11 |
| Comparative Example 4 | 2100 | 4.1 | 2.2 | 2.8 | 10 |
| Comparative Example 5 | 1970 | 3.6 | 2.1 | 2.8 | 9 |

* The numerals before and after the slash for EVA denote ethylene units and vinyl acetate units, respectively.

As apparent from Table 1, the acoustic backing members for Examples 1 to 7, in which the base resin of EVA containing 20 to 80% by weight of the vinyl acetate units contained fibers or inorganic powders as fillers, exhibited an appropriate acoustic impedance (AI) of 3.1 to 7.9 MRalys and a high attenuation rate of 3.1 to 4.8 dB/mm MHz. Further, a defective channel was unlikely to be formed in the dicing process. Particularly, the acoustic backing members for Examples 4 to 7, in which SiC fibers or $Al_2O_3$ fibers were used as the fillers, were found to exhibit an attenuation rate higher than that of the acoustic backing member for each of Examples 2 and 3 in which an inorganic powder was used as the filler.

As a result, it was possible to decrease the thickness of the acoustic backing member for each of Examples 1 to 7, and the ultrasonic probe could be miniaturized by incorporating the thin acoustic backing member for each of these Examples in the ultrasonic probe. Also, since a defective channel is unlikely to be generated in the acoustic backing member for each of Examples 1 to 7, the sensitivity of the ultrasonic probe can be improved by incorporating the acoustic backing member for each of these Examples in the ultrasonic probe. Particularly, the acoustic backing member for each of Examples 4 and 5, in which SiC fiber was used as the filler, exhibited a high heat conductivity, which was not lower than 3.3 W/mK. Such being the situation, the surface of the ultrasonic probe can be maintained at a low temperature by incorporating the acoustic backing member for each of these Examples in the ultrasonic probe. It follows that the signal transmitting voltage can be increased by incorporating any of these ultrasonic probes in an ultrasonic diagnostic apparatus so as to make it possible to increase the range of the diagnostic region that can be observed. For example, a deep portion of the human body can be observed.

On the other hand, the acoustic backing member for Comparative Example 1, in which an epoxy resin was used as the base resin, was found to be low in attenuation rate. In addition, the defective channel ratio was markedly increased in the dicing process. The increase in the defective channel ratio was caused by ruptures and peeling that took place in the dicing stage between the epoxy resin and the alumina fiber contained as a filler in the epoxy resin.

Further, the acoustic backing member for each of Comparative Examples 2 to 5, in which a butyl rubber, a chloroprene rubber, a normal butylene rubber and an urethane rubber were used as base resins, respectively, was found to be low in attenuation rate. In addition, the defective channel ratio was increased in the dicing stage. It should be noted that the epoxy resin series adhesive used for bonding the piezoelectric element was deteriorated during the heating at 120° C. for about one hour for curing the adhesive so as to bring about the increase in the defective channel ratio.

EXAMPLES 8 TO 18

Eleven kinds of acoustic backing members for evaluation were obtained as in Example 1, except that the ratios of the ethylene units to the vinyl acetate units in the base resin of EVA and the amounts of carbon fibers used were set as shown in Table 2. Incidentally, the pitch series carbon fibers having a heat conductivity of 500 W/mK were used as the filler. Also, 25% by volume of the loading amounts of the carbon fibers in the acoustic backing member for evaluation were aligned at an angle of 30° or less relative to the axis in the thickness direction of the acoustic backing member.

The density, the sound velocity, the acoustic impedance (AI), the attenuation rate, the heat conductivity, and the defective channel ratio were measured as in Example 1 for each of the acoustic backing members for evaluation for Examples 8 to 18. Table 2 shows the results.

TABLE 2

| | Composition of acoustic backing member | | | |
|---|---|---|---|---|
| | | Carbon fiber | | |
| | Base resin | Size; Average diameter (μm)/Average length (mm) | Amount (vol. %) | Density of acoustic backing member (g/cm$^3$) |
| Example 8 | EVA: 80/20 | 7/20 | 20 | 1.14 |
| Example 9 | EVA: 70/30 | 7/20 | 25 | 1.20 |
| Example 10 | EVA: 60/40 | 10/20 | 30 | 1.27 |
| Example 11 | EVA: 50/50 | 10/20 | 30 | 1.30 |
| Example 12 | EVA: 50/50 | 10/20 | 35 | 1.34 |

TABLE 2-continued

| | | | | |
|---|---|---|---|---|
| Example 13 | EVA: 50/50 | 10/20 | 40 | 1.41 |
| Example 14 | EVA: 50/50 | 10/20 | 45 | 1.47 |
| Example 15 | EVA: 50/50 | 10/20 | 50 | 1.54 |
| Example 16 | EVA: 40/60 | 10/20 | 55 | 1.61 |
| Example 17 | EVA: 20/80 | 20/20 | 60 | 1.68 |
| Example 18 | EVA: 50/50 | 20/20 | 70 | 1.81 |

| | Characteristics of acoustic backing member | | | | |
|---|---|---|---|---|---|
| | Acoustic velocity (m/s) | AI (MRayls) | Attenuation rate (dB/mm MHz) | Heat conductivity (W/mK) | Defective channel ratio (%) |
| Example 8 | 1790 | 2.0 | 4.4 | 4.0 | 0 |
| Example 9 | 1980 | 2.4 | 3.7 | 5.2 | 0 |
| Example 10 | 2030 | 2.6 | 3.8 | 5.9 | 0 |
| Example 11 | 1950 | 2.5 | 4.4 | 7.7 | 0 |
| Example 12 | 2240 | 3.0 | 5.1 | 6.3 | 0 |
| Example 13 | 2750 | 3.9 | 5.0 | 7.0 | 0 |
| Example 14 | 2880 | 4.2 | 4.8 | 7.5 | 0 |
| Example 15 | 2980 | 4.6 | 4.5 | 8.8 | 0 |
| Example 16 | 3760 | 6.1 | 4.8 | 13.8 | 0 |
| Example 17 | 3900 | 6.6 | 5.7 | 16.2 | 0 |
| Example 18 | 4200 | 7.6 | 6.0 | 19.4 | 0.4 |

* The numerals before and after the slash for EVA denote ethylene units and vinyl acetate units, respectively.

As apparent from Table 2, the acoustic backing member for each of Examples 8 to 18, in which carbon fibers used as a filler were contained in the base resin of EVA having 20 to 80% by weight of the vinyl acetate content, exhibited an appropriate acoustic impedance of 2.0 to 7.6 MRalys. Also, the acoustic backing members for these Examples exhibited attenuation rates of 3.6 to 6.0 dB/mm MHz, which are higher than those of the acoustic backing members for Comparative Examples 1 to 5 shown in Table 1. In addition, defective channels ware unlikely to be generated in the dicing process in Examples 8 to 18.

It should be noted in particular that the acoustic backing members in, for example, Examples 4 and 15 were equal in the content of the vinyl acetate units in the base resin of EVA and in the amount of filler contained in the base resin of EVA, though SiC fibers and carbon fibers were used as the fillers in Examples 4 and 15, respectively, as shown in Tables 1 and 2. What should also be noted is that the attenuation rates for Examples 4 and 15 were 4.5 dB/mm MHz and 5.0 dB/mm MHz, respectively. It follows that an acoustic backing member exhibiting a further improved attenuation rate can be obtained by using the carbon fiber as the filler.

As a result, it is possible to further decrease the thickness of the acoustic backing member for each of Examples 8 to 18 so as to make it possible to miniaturize the ultrasonic probe having the acoustic backing member incorporated therein. Also, defective channels are unlikely to be generated in the acoustic backing member for each of Examples 8 to 18 so as to make it possible to increase the sensitivity of the ultrasonic probe having the acoustic backing member for each of Examples 8 to 18 incorporated therein. Further, the acoustic backing member for each of Examples 8 to 18 having carbon fibers loaded therein as a filler exhibits a high heat conductivity of 4.0 W/mK or more, with the result that a low temperature is maintained on the surface of the ultrasonic probe by incorporating the acoustic backing member for each of Examples 8 to 18 in the ultrasonic probe. It follows that the signal transmitting voltage can be increased by incorporating the particular ultrasonic probe in an ultrasonic diagnostic apparatus so as to make it possible to increase the range of the diagnostic region that can be observed. For example, a deep portion of the human body can be observed.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An ultrasonic probe comprising:

a plurality of channels arrayed forming spaces between the channels, and each having a piezoelectric element and an acoustic matching layer formed on the piezoelectric element;

a sheet-like acoustic backing member on which the piezoelectric elements are provided, and which have grooves formed in conformity with the spaces; and an acoustic lens formed on the acoustic matching layers;

wherein the acoustic backing member comprises an ethylene-vinyl acetate copolymer containing 20 to 80% by weight of the vinyl acetate units and a filler contained in the ethylene-vinyl acetate copolymer.

2. The ultrasonic probe according to claim 1, wherein the filler is contained in the acoustic backing member in an amount of 20 to 70% by volume.

3. The ultrasonic probe according to claim 1, wherein fibers are used as the filler contained in the acoustic backing member.

4. The ultrasonic probe according to claim 3, wherein the fibers have a diameter of 20 μm or less and a length of five times or more of the diameter.

5. The ultrasonic probe according to claim 3, wherein the fibers are at least one kind of fibers selected from the group consisting of carbon fibers, silicon carbide fibers and alumina fibers.

6. The ultrasonic probe according to claim 5, wherein the fibers have a density of 2.1 g/$cm^3$ or more and a heat conductivity of 100 W/mK or more.

7. The ultrasonic probe according to claim 3, wherein fibers having an average diameter of 20 μm or less and an average length of 5 mm or more are contained in the acoustic backing member in an amount of 20 to 70% by volume, and 20 to 80% by volume of all the fibers contained in the acoustic backing member are aligned at an angle of 30° or less relative to the axis in the thickness direction of the acoustic backing member.

8. The ultrasonic probe according to claim 3, wherein the loaded fibers are positioned partly in the region between the adjacent grooves formed in the acoustic backing member and in the region between the groove and the side surface of the acoustic backing member.

9. The ultrasonic probe according to claim 1, wherein the filler loaded in the acoustic backing member is particles of an inorganic material selected from the group consisting of zinc oxide, zirconium oxide, aluminum oxide, silicon oxide, titanium oxide, silicon carbide, aluminum nitride, and boron nitride.

10. The ultrasonic probe according to claim 1, wherein a powder of at least one metal selected from the group consisting of tungsten, molybdenum and silver is further contained in the acoustic backing member.

11. The ultrasonic probe according to claim 1, wherein the acoustic backing member has a density of 2.0 g/$cm^3$ or less.

12. The ultrasonic probe according to claim 1, wherein the acoustic backing member has an acoustic impedance of 2 to 8 MRalys, a heat conductivity of 5 W/mK or more, and a density of 2.0 g/$cm^3$ or less.

13. An ultrasonic diagnostic apparatus, comprising:

an ultrasonic probe comprising, a plurality of channels arrayed forming spaces between the channels, and each having a piezoelectric element and an acoustic matching layer formed on the piezoelectric element;

a sheet-like acoustic backing member on which the piezoelectric elements are provided, and which have grooves formed in conformity with the spaces; and an acoustic lens formed on the acoustic matching layers;

wherein the acoustic backing member comprises an ethylene-vinyl acetate copolymer containing 20 to 80% by weight of the vinyl acetate units and a filler contained in the ethylene-vinyl acetate copolymer, and an ultrasonic probe controller connected to the ultrasonic probe via a cable.

14. The ultrasonic diagnostic apparatus according to claim 13, wherein the acoustic backing member contains as the filler 20 to 70% by volume of fibers having a diameter of 20 μm or less and a length of five times or more of the diameter, and 20 to 80% by volume of all the fibers loaded as the filler are aligned at an angle of 30° or less relative to the axis in the thickness direction of the acoustic backing member.

* * * * *